(12) United States Patent
Iisaka

(10) Patent No.: US 9,551,755 B2
(45) Date of Patent: Jan. 24, 2017

(54) RELAY WELD DIAGNOSTIC DEVICE

(71) Applicant: Panasonic Corporation, Osaka (JP)

(72) Inventor: Atsushi Iisaka, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 235 days.

(21) Appl. No.: 14/388,449

(22) PCT Filed: Mar. 4, 2013

(86) PCT No.: PCT/JP2013/001311
§ 371 (c)(1),
(2) Date: Sep. 26, 2014

(87) PCT Pub. No.: WO2013/145562
PCT Pub. Date: Oct. 3, 2013

(65) Prior Publication Data
US 2015/0054516 A1 Feb. 26, 2015

(30) Foreign Application Priority Data
Mar. 29, 2012 (JP) ................. 2012-076075

(51) Int. Cl.
*G01R 31/02* (2006.01)
*G01R 31/327* (2006.01)
(Continued)

(52) U.S. Cl.
CPC ......... *G01R 31/3278* (2013.01); *B60L 3/0069* (2013.01); *B60L 3/0084* (2013.01);
(Continued)

(58) Field of Classification Search
CPC . B60L 11/1816; B60L 11/1846; B60L 11/185; B60L 11/1864; B60L 2210/30; B60L 2210/40; B60L 2240/547; B60L 2250/10; B60L 2250/16; B60L 3/0069; B60L 3/0084; B60L 3/04; B60L 3/12; G01R 31/025; G01R 31/3278; H01H 2047/003
(Continued)

(56) References Cited

U.S. PATENT DOCUMENTS

2011/0163759 A1* 7/2011 Ishii ...................... H02H 3/162
324/551

FOREIGN PATENT DOCUMENTS

| JP | 08-070503 A | 3/1996 |
| JP | 2933490 A | 3/1996 |

(Continued)

OTHER PUBLICATIONS

International Search Report for Application No. PCT/JP2013/001311 dated May 28, 2013.
(Continued)

*Primary Examiner* — Vincent Q Nguyen
(74) *Attorney, Agent, or Firm* — Pearne & Gordon LLP

(57) ABSTRACT

In relay weld diagnostic device, a threshold value determination unit (104) determines a threshold value on the basis of a resistance value that is set for each of a P-pole-side resistor (24) and an N-pole-side resistor (23) provided to charging equipment. A peak value measuring unit (110) measures the peak value of a voltage supplied to a voltage line by an alternating-current signal output circuit (112). A comparison diagnosis unit (111) assesses the state of a relay (14) on the P-pole side and a relay (15) on the N-pole side by comparing the peak value and the threshold value, and makes a diagnosis as to whether the relays (14), (15) are welded on the basis of the assessed state of the relays (14), (15) and the state in which the relays (14), (15) are controlled.

6 Claims, 6 Drawing Sheets

(51) Int. Cl.
  *B60L 3/00* (2006.01)
  *B60L 3/04* (2006.01)
  *B60L 3/12* (2006.01)
  *B60L 11/18* (2006.01)
  *H01H 47/00* (2006.01)

(52) U.S. Cl.
  CPC  *B60L 3/04* (2013.01); *B60L 3/12* (2013.01); *B60L 11/185* (2013.01); *B60L 11/1816* (2013.01); *B60L 11/1846* (2013.01); *B60L 11/1864* (2013.01); *B60L 2210/30* (2013.01); *B60L 2210/40* (2013.01); *B60L 2240/547* (2013.01); *B60L 2250/10* (2013.01); *B60L 2250/16* (2013.01); *H01H 2047/003* (2013.01); *Y02T 10/7005* (2013.01); *Y02T 10/7061* (2013.01); *Y02T 10/7072* (2013.01); *Y02T 10/7241* (2013.01); *Y02T 90/121* (2013.01); *Y02T 90/127* (2013.01); *Y02T 90/128* (2013.01); *Y02T 90/14* (2013.01); *Y02T 90/169* (2013.01); *Y04S 30/14* (2013.01)

(58) Field of Classification Search
  USPC .................................. 324/551, 420–424
  See application file for complete search history.

(56) References Cited

FOREIGN PATENT DOCUMENTS

| JP | 2003-169401 A | 6/2003 |
| JP | 2010-238576 A | 10/2010 |
| JP | 2010-239827 A | 10/2010 |
| JP | 2011-015567 A | 1/2011 |
| JP | 2011-160604 A | 8/2011 |
| JP | 2011-185812 A | 9/2011 |

OTHER PUBLICATIONS

Extended European Search Report for Application No. 13768402.3-1560/2833498 PCT/JP2013001311 dated Mar. 26, 2015.

* cited by examiner

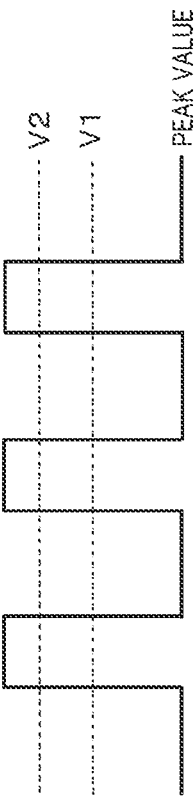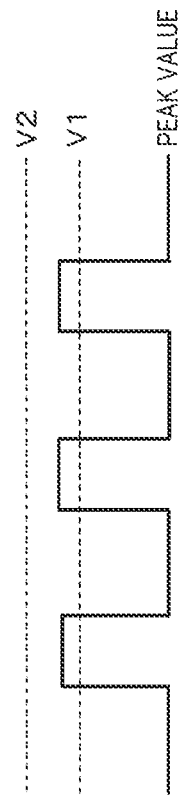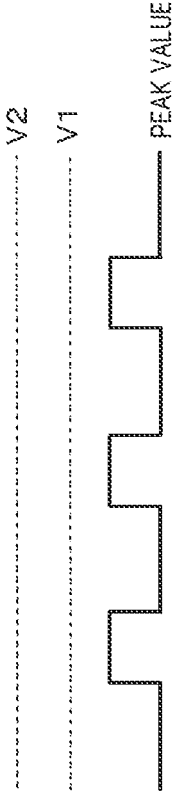

RELAY WELD DIAGNOSTIC DEVICE

TECHNICAL FIELD

The present invention relates to a relay welding diagnostic apparatus for a relay used in a charging circuit for charging a battery of an electric automobile or the like.

BACKGROUND ART

Conventionally, in a charging circuit of electric automobiles such as EVs (Electric Vehicles) and PHEVs (Plug-in Hybrid Electric Vehicles) that can travel by using an electric energy accumulated in a battery as a driving source, a relay circuit for connecting or disconnecting a boost charging facility and a battery connection junction circuit at the time of charging is provided. Such a relay circuit includes a mechanical relay junction (hereinafter referred to as "relay"), and welding of the relay may be caused by the on/off performed with a high voltage and high current.

PTL 1, for example, discloses a technique for detecting welding of the relay. In the technique disclosed in PTL 1, the voltage across a positive electrode line and a negative electrode line is measured with a voltage detection circuit, and whether relays are welded is determined on the basis of results of the measurement.

CITATION LIST

Patent Literature

PTL 1
Japanese Patent Application Laid-Open No. 2011-015567

SUMMARY OF INVENTION

Technical Problem

However, in the technique disclosed in PTL 1, whether relays are welded cannot be determined when the voltage detection circuit is broken.

An object of the present invention is to provide a relay welding diagnostic apparatus that can determine whether relays are welded without using a voltage detection circuit.

Solution to Problem

A relay welding diagnostic apparatus of an embodiment of the present invention is configured to determine whether relays are welded, the relays being respectively provided on a P electrode side and an N electrode side of a voltage line connecting a charging facility and a battery together, the relay welding diagnostic apparatus including: a threshold value determination section that determines a threshold value on the basis of resistance values set to a resistor on a P electrode side and a resistor on an N electrode side, the resistors being provided in the charging facility; a signal output circuit that supplies a predetermined voltage to the voltage line; a peak value measurement section that measures a peak value of the voltage supplied to the voltage line from the signal output circuit; and a comparison diagnosis section that determines a state of the relay by comparing the peak value with the threshold value, and determines whether the relay is welded on the basis of the state of the relay thus determined and a state set to the relay.

Advantageous Effects of Invention

According to the present invention, whether relays are welded can be determined without using a voltage detection circuit.

BRIEF DESCRIPTION OF DRAWINGS

FIGS. 6A to 6C illustrate an exemplary relationship between a peak value and a threshold value in a determination process according to the embodiment of the present invention.

DESCRIPTION OF EMBODIMENTS

Now, an embodiment of the present invention will be described with reference to the accompanying drawings.

Figure 1:
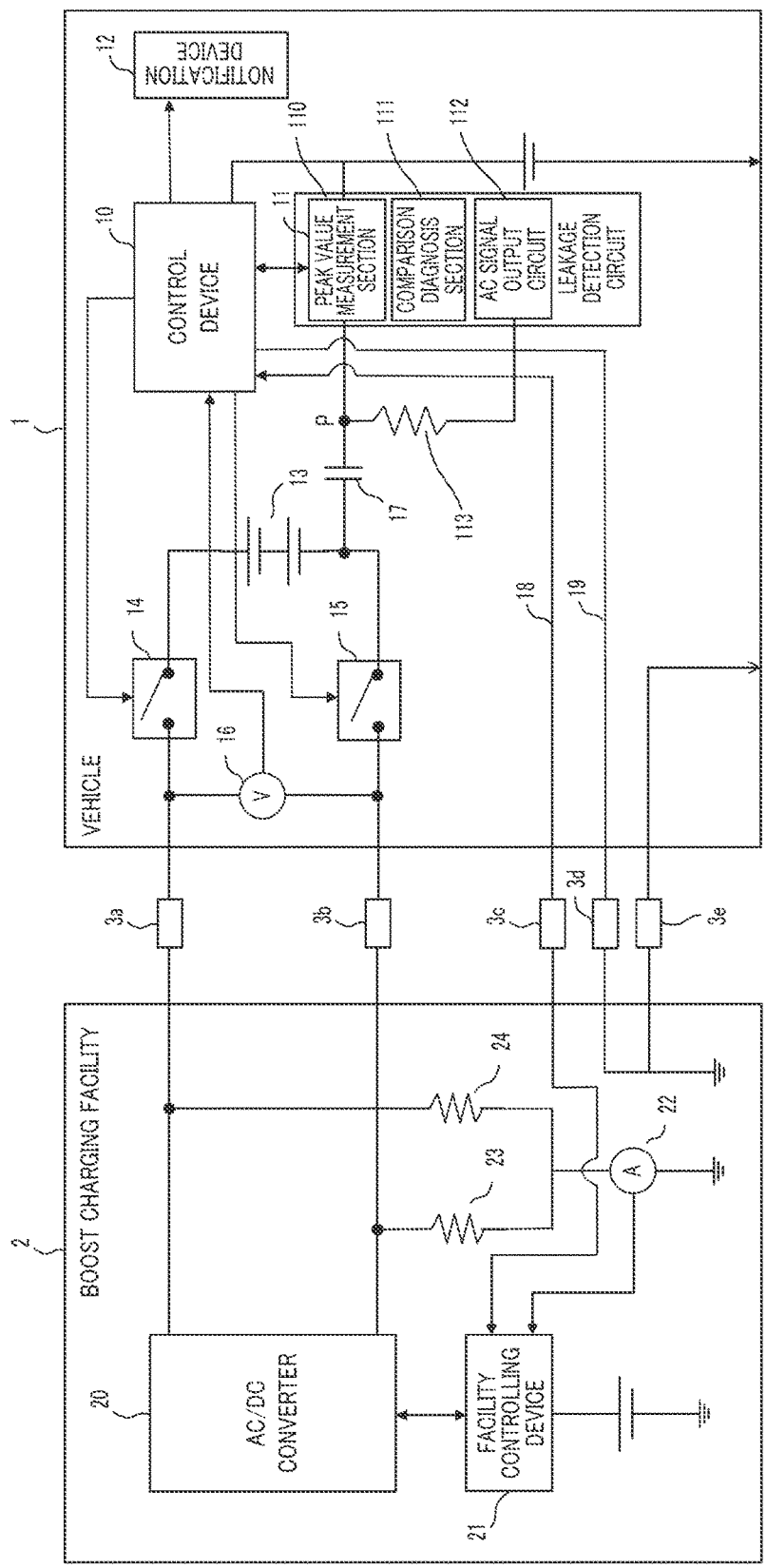
FIG. 1 illustrates a configuration of a power system of an electric automobile and a boost charging facility according to an embodiment of the present invention.

First, an overall configuration of an electric automobile and a boost charging facility according to an embodiment of the present invention is described with reference to FIG. 1. FIG. 1 illustrates an exemplary configuration of a power system of the electric automobile and the boost charging facility according to the present embodiment.

Vehicle 1 is an electric automobile. Vehicle 1 includes control apparatus 10, leakage detection circuit 11, notification apparatus 12, battery 13, relay 14, relay 15, voltage detection circuit 16, capacitor 17, communication line 18, and signal line 19.

Boost charging facility 2 is a facility (including a device or a system) for charging vehicle 1. Boost charging facility 2 includes AC/DC converting apparatus 20, facility controlling apparatus 21, ammeter 22, resistor 23, and resistor 24.

At the time of charging battery 13, vehicle 1 and boost charging facility 2 are connected through a connector. In the example illustrated in FIG. 1, vehicle 1 and boost charging facility 2 are connected through five connectors 3a, 3b, 3c, 3d and 3e.

Connector 3a connects a high pressure line (positive electrode line) on the positive side between vehicle 1 and boost charging facility 2. Thus, AC/DC converting apparatus 20 and resistor 24 are connected to relay 14. That is, resistor 24 is a resistor on the P electrode side, and relay 14 is a relay on the P electrode side.

Connector 3b connects a high pressure line (negative electrode line) on the negative side between vehicle 1 and boost charging facility 2. Thus, AC/DC converting apparatus 20 and resistor 23 are connected to relay 15. That is, resistor 23 is a resistor on the N electrode side, and relay 15 is a relay on the N electrode side.

Connector 3c connects communication line 18 between vehicle 1 and boost charging facility 2. Thus, facility controlling apparatus 21 and control apparatus 10 are connected together.

Connector 3d connects signal line 19 between vehicle 1 and boost charging facility 2. Thus, the ground of boost charging facility 2 and control apparatus 10 are connected together.

Connector 3e connects the ground of boost charging facility 2 and the vehicle body of vehicle 1 between vehicle 1 and boost charging facility 2.

It is to be noted that, the above-mentioned five connectors 3a, 3b, 3c, 3d and 3e are collectively connected.

When the connectors are connected in the above-mentioned manner, control apparatus 10 receives a signal generated in response to the connection of connector 3d through signal line 19, thereby detecting a connection with boost charging facility 2. It is to be noted that control apparatus 10 is, for example, an ECU (Electronic Control Unit).

In addition, control apparatus 10 sends a relay control signal to relay 14 and relay 15, to turn on or off (close or open) relay 14 and relay 15. When relay 14 and relay 15 are turned on, AC/DC converting apparatus 20 and battery 13 are connected together through the positive electrode line and the negative electrode line. In the example illustrated in FIG. 1, relay 14 and relay 15 are both in the off state.

In addition, when starting the charging of battery 13, control apparatus 10 sends a charging start control signal for starting the charging to facility controlling apparatus 21 through communication line 18. When receiving this signal, facility controlling apparatus 21 requests AC/DC converting apparatus 20 to start power supply. Thus, power is supplied from AC/DC converting apparatus 20 to battery 13, and charging of battery 13 is started.

When charging of battery 13 is started, facility controlling apparatus 21 performs a leakage detection on boost charging facility 2 side on the basis of current values measured by ammeter 22. The current values measured by ammeter 22 are values of current flowing through resistor 23 and resistor 24 that are used to the leakage detection.

It is to be noted that the technique disclosed in Japanese Patent Application Laid-Open No. 2010-239827, for example, may be adopted as the leakage detection on boost charging facility 2 side in this example.

Likewise, when charging of battery 13 is started, leakage detection circuit 11 performs a leakage detection on vehicle 1 side on the basis of a voltage at junction P between capacitor 17 and resistor 113. It is to be noted that the technique disclosed in Japanese Patent Application Laid-Open No. 08-70503, for example, may be adopted as the leakage detection of vehicle 1 side in this example. In addition, leakage detection circuit 11 includes peak value measurement section 110, comparison diagnosis section 111, and AC signal output circuit 112, and details of these components will be described later with reference to FIG. 2.

In the present embodiment, leakage detection circuit 11 allows for a relay diagnosis mode in which welding of relays 14 and 15 is determined, in addition to the leakage detection mode in which the leakage detection on vehicle 1 side is performed. Details of the relay diagnosis mode will be described later.

When leakage in vehicle 1 is detected, leakage detection circuit 11 notifies control apparatus 10 of the fact that leakage is detected. In response to the notification, control apparatus 10 controls notification apparatus 12 to notify the user of the fact that leakage is detected in vehicle 1. Examples of notification apparatus 12 include, for example, a display and a speaker.

Voltage detection circuit 16 measures a voltage across the positive electrode line and the negative electrode line, and sends a voltage value thus obtained to control apparatus 10. On the basis of a voltage value notified from voltage detection circuit 16, control apparatus 10 performs a normal relay welding diagnosis. The technique disclosed in PTL 1 may be adopted as the normal relay welding diagnosis is, for example.

In addition, in the present embodiment, control apparatus 10 performs a voltage detection circuit diagnosis on the basis of voltage value measured by voltage detection circuit 16. This will be described later.

Figure 2:
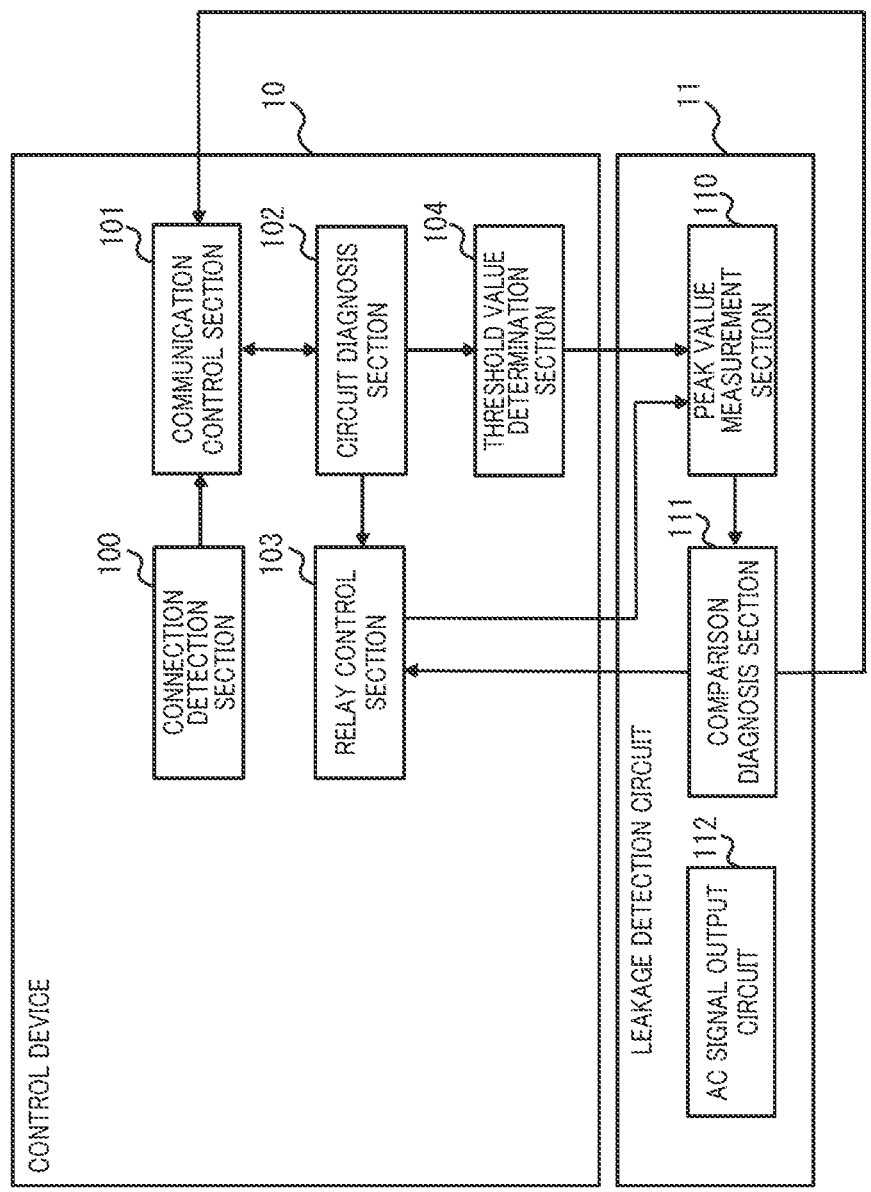
FIG. 2 is a block diagram illustrating a configuration of a relay welding diagnostic apparatus according to the embodiment of the present invention.

Next, a configuration of a relay welding diagnostic apparatus according to the present embodiment will be described with reference to FIG. 2. FIG. 2 is a block diagram illustrating an exemplary configuration of the relay welding diagnostic apparatus of the present embodiment.

The relay welding diagnostic apparatus of the present embodiment includes control apparatus 10 and leakage detection circuit 11.

Control apparatus 10 includes connection detection section 100, communication control section 101, circuit diagnosis section 102, relay control section 103, and threshold value determination section 104.

Connection detection section 100 detects a connection between vehicle 1 and boost charging facility 2.

In the present embodiment, when a signal generated in response to the connection of connector 3d is received from signal line 19, detection section 100 detects a connection between vehicle 1 and boost charging facility 2 as described above. Then, connection detection section 100 notifies communication control section 101 of the fact that a connection between vehicle 1 and boost charging facility 2 is detected.

Communication control section 101 transmits and receives information and signals to and from facility controlling apparatus 21 of boost charging facility 2, through communication line 18.

For example, when receiving a notification of a fact that a connection between vehicle 1 and boost charging facility 2 from connection detection section 100 is detected, communication control section 101 starts a communication with facility controlling apparatus 21, and maintains the communication. Thus, communication control section 101 and facility controlling apparatus 21 share the fact that vehicle 1 and boost charging facility 2 are connected together.

In addition, for example, at the time of starting the charging of battery 13, communication control section 101 sends the above-described charging start control signal to facility controlling apparatus 21. At this time, communication control section 101 notifies leakage detection circuit 11 of the fact that charging will be started.

In addition, for example, when receiving a notification of diagnosis results obtained by the normal relay welding diagnosis from circuit diagnosis section 102, or when receiving a notification of diagnosis results obtained by the relay diagnosis mode from leakage detection circuit 11, communication control section 101 terminates the communication with facility controlling apparatus 21. It is to be noted that, when receiving a notification of any of the above-mentioned diagnosis results, communication control section 101 outputs the notification to notification apparatus 12. Notification apparatus 12 notifies the user of the diagnosis result.

On the basis of the voltage value notified from voltage detection circuit 16, circuit diagnosis section 102 performs a voltage detection circuit diagnosis. This diagnosis is a determination whether voltage detection circuit 16 is broken.

First, when receiving from communication control section 101 a notification of a fact that communication with facility controlling apparatus 21 is started, circuit diagnosis section 102 performs a voltage detection circuit diagnosis. This diagnosis is referred to as "voltage detection circuit diagnosis 1," which is performed before relays 14 and 15 are turned on, that is, when relays 14 and 15 are in an off state. In voltage detection circuit diagnosis 1, when no voltage value is notified from voltage detection circuit 16, circuit diagnosis section 102 determines that voltage detection circuit 16 is not broken. In other words, in voltage detection circuit diagnosis 1, when there is a voltage value notified from voltage detection circuit 16, circuit diagnosis section 102 determines that voltage detection circuit 16 is broken. Then, circuit diagnosis section 102 notifies relay control section 103 of the fact that voltage detection circuit diagnosis 1 is terminated.

Thereafter, when the charging of battery 13 is terminated, circuit diagnosis section 102 again performs a voltage detection circuit diagnosis. This diagnosis is referred to as "voltage detection circuit diagnosis 2,"which is performed when relays 14 and 15 are in an on state. In voltage detection circuit diagnosis 2, when there is a voltage value notified from voltage detection circuit 16, circuit diagnosis section 102 determines that voltage detection circuit 16 is not broken. In other words, in voltage detection circuit diagnosis 2, when no voltage value is notified from voltage detection circuit 16, circuit diagnosis section 102 determines that voltage detection circuit 16 is broken.

It is to be noted that examples of the method for detecting a completion of charging of battery 13 by circuit diagnosis section 102 at the time of starting voltage detection circuit diagnosis 2 are as follows. For example, when receiving information representing "completion of charging" from boost charging facility 2, circuit diagnosis section 102 detects the completion of the charging. The information representing the "completion of charging" is sent from boost charging facility 2 to control apparatus 10 through communication line 18 when the user pushes a charging stop button (not illustrated) of boost charging facility 2. Alternatively, for example, when information representing "full charge" is received from an ECU (not illustrated) which can detect a state of battery 13, circuit diagnosis section 102 detects the completion of charging. The information representing "full charge" is sent from the ECU to control apparatus 10 through a signal line (not illustrated) when the ECU detects the fact that charging of battery 13 is completed.

When results of voltage detection circuit diagnoses 1 and 2 are both that "voltage detection circuit 16 is not broken" (hereinafter referred to as "not broken"), circuit diagnosis section 102 performs the normal relay welding diagnosis. As described above, the normal relay welding diagnosis is a relay welding diagnosis which is performed on the basis of a voltage notified from voltage detection circuit 16, and an example of the normal relay welding diagnosis is the diagnosis disclosed in PTL 1. Then, when the normal relay welding diagnosis is terminated, circuit diagnosis section 102 notifies communication control section 101 of the results of the diagnosis.

On the other hand, when at least one of results of voltage detection circuit diagnoses 1 and 2 is that "voltage detection circuit 16 is broken"(hereinafter referred to as "broken"), circuit diagnosis section 102 notifies threshold value determination section 104 of "broken."

Relay control section 103 outputs the above-mentioned relay control signal to relays 14 and 15, and sets relays 14 and 15 to an on or off state.

For example, when a notification of a fact that voltage detection circuit diagnosis 1 is terminated is received from circuit diagnosis section 102, relay control section 103 outputs to both relays 14 and 15 relay control signals for turning on relays 14 and 15.

In addition, for example, when receiving a request to output a relay control signal from leakage detection circuit 11, relay control section 103 outputs to at least one of relays 14 and 15 a relay control signal for turning on or off relay 14 or 15. Thereafter, relay control section 103 notifies leakage detection circuit 11 of the fact that the relay control signal is output.

Threshold value determination section 104 determines a threshold value which is used by leakage detection circuit 11 in the relay diagnosis mode, and notifies leakage detection circuit 11 of the threshold value thus determined.

As described above, while the leakage detection mode and the relay diagnosis mode can be switched during the operation of leakage detection circuit 11, the threshold values used in the modes are different from each other. In the following description, the threshold value used in the leakage detection mode is $V0$. In addition, the threshold value used in relay diagnosis mode is $V1$ (an example of first threshold value) and $V2$ (an example of second threshold value). The level relationship between the threshold values is that $V2$ is the maximum value and $V0$ is the minimum value. It is to be noted that $V0$ is set in advance in leakage detection circuit 11.

When receiving from circuit diagnosis section 102 a notification of "broken," threshold value determination section 104 determines threshold values $V1$ and $V2$ by a predetermined determination method. Then, threshold value determination section 104 notifies leakage detection circuit 11 of threshold values $V1$ and $V2$ thus determined. When receiving this notification, leakage detection circuit 11 switches the operation from the leakage detection mode to the relay diagnosis mode. It is to be noted that the operation in the relay diagnosis mode may be referred to as "relay welding diagnosis of the present embodiment" in contrast to the above-mentioned normal relay welding diagnosis.

Here, the method for determining threshold values $V1$ and $V2$ performed by threshold value determination section 104 will be described. Examples of the method include the following methods (1) to (3).

(1) When a resistance value is specified in the standard of boost charging facility 2, threshold value determination section 104 determines threshold values $V1$ and $V2$ on the basis of the resistance value and the constant set in leakage detection circuit 11. The resistance value herein is the values of resistors 23 and 24 (the same shall apply hereinafter).

(2) When the resistance value can be acquired through the communication with boost charging facility 2, threshold value determination section 104 acquires the resistance value from facility controlling apparatus 21. Then, threshold value determination section 104 determines threshold values $V1$ and $V2$ on the basis of the resistance value and the constant set in leakage detection circuit 11.

(3) In the cases other than the above-mentioned (1) and (2), threshold value determination section 104 calculates the following expression to determine threshold values $V1$ and $V2$. It is to be noted that "A" in the following expression represents a peak level which is obtained when vehicle 1 is in a travel mode when vehicle 1 a stopped state (when vehicle 1 is not boost charged, and inverter and the like are not operated). In addition, "B" in the following expression represents a peak level which is obtained when the relays on the both electrode sides are both in the on state during the relay welding diagnosis.

$$V1=B+(A-B)\times0.2$$

$$V2=B+(A-B)\times0.7$$

In the case of the above-mentioned (3), resistors 23 and 24 of boost charging facility 2 have the same constant set in advance. In addition, the resistance value of ammeter 22 is a substantially negligible value. It is to be noted that, the peak level in the case where the relay on one electrode side is in an on state is a substantially intermediate value between A and B. In the case of (3), when there is no significant difference between peak levels A and B, leakage detection circuit 11 determines that the diagnosis cannot be performed (step S460 of FIG. 4 described later).

Leakage detection circuit 11 includes peak value measurement section 110, comparison diagnosis section 111, and AC signal output circuit 112 (an example of the signal output circuit).

AC signal output circuit 112 has a built-in oscillation circuit not illustrated. For example, when performing a leakage detection (leakage detection mode), or when performing a relay welding diagnosis (relay diagnosis mode), AC signal output circuit 112 supplies a predetermined AC voltage to a high pressure line. An output terminal of AC signal output circuit 112 is connected with a high pressure line through resistor 113 and capacitor 17, in this order, as illustrated in FIG. 1.

Peak value measurement section 110 measures a peak value of a voltage at junction P which is a junction of capacitor 17 and resistor 113. A voltage at junction P is a voltage supplied by AC signal output circuit 112 to the high pressure line.

To be more specific, when receiving a notification of threshold values V1 and V2 from threshold value determination section 104, peak value measurement section 110 is shifted to the relay diagnosis mode, and the operation of peak value measurement section 110 is started. Thus, as described above, AC signal output circuit 112 supplies a predetermined alternating current to the high pressure line. Then, first, peak value measurement section 110 stands by until the peak value of the voltage of junction P is stabilized (for example, for about three seconds). Then, peak value measurement section 110 smoothens the peak value of junction P to perform an analog/digital conversion. In this manner, peak value measurement section 110 measures a peak value.

It is to be noted that, after receiving the notification of threshold values V1 and V2, peak value measurement section 110 occasionally repeats the measurement of the peak value. In that case, when receiving a notification of a fact that a relay control signal is output from relay control section 103, peak value measurement section 110 again measures the peak value.

Then peak value measurement section 110 notifies comparison diagnosis section 111 of peak value 2 measured in the above-mentioned manner. It is to be noted that, at the time of the first measurement of the peak value, peak value measurement section 110 also notifies comparison diagnosis section 111 of the measured threshold values V1 and V2.

Comparison diagnosis section 111 compares the measurement peak value with the notified threshold value, and determines whether relay 14 and relay 15 are in the on state or off state (hereinafter referred to as "relay state").

To be more specific, when receiving a notification of a measured peak value and threshold values V1 and V2 from peak value measurement section 110, comparison diagnosis section 111 compares the peak value with V1 and V2. On the basis of the results of the comparison, comparison diagnosis section 111 determines the relay state. The details of the determination of the relay state will be described later with reference to FIGS. 6A to 6C.

On the basis of the results of the determination of the relay state, comparison diagnosis section 111 determines whether relays 14 and 15 are welded. Comparison determination section 111 notifies the results of the diagnosis (result of the diagnosis by the relay diagnosis mode) of communication control section 101 of control apparatus 10.

On the other hand, when the diagnosis result cannot be obtained, comparison diagnosis section 111 requests the output of the relay control signal to relay control section 103 of control apparatus 10.

It is to be noted that, comparison diagnosis section 111 may perform both of the notification of diagnosis result by the relay diagnosis mode, and the request of the output of the relay control signal.

Figure 3:
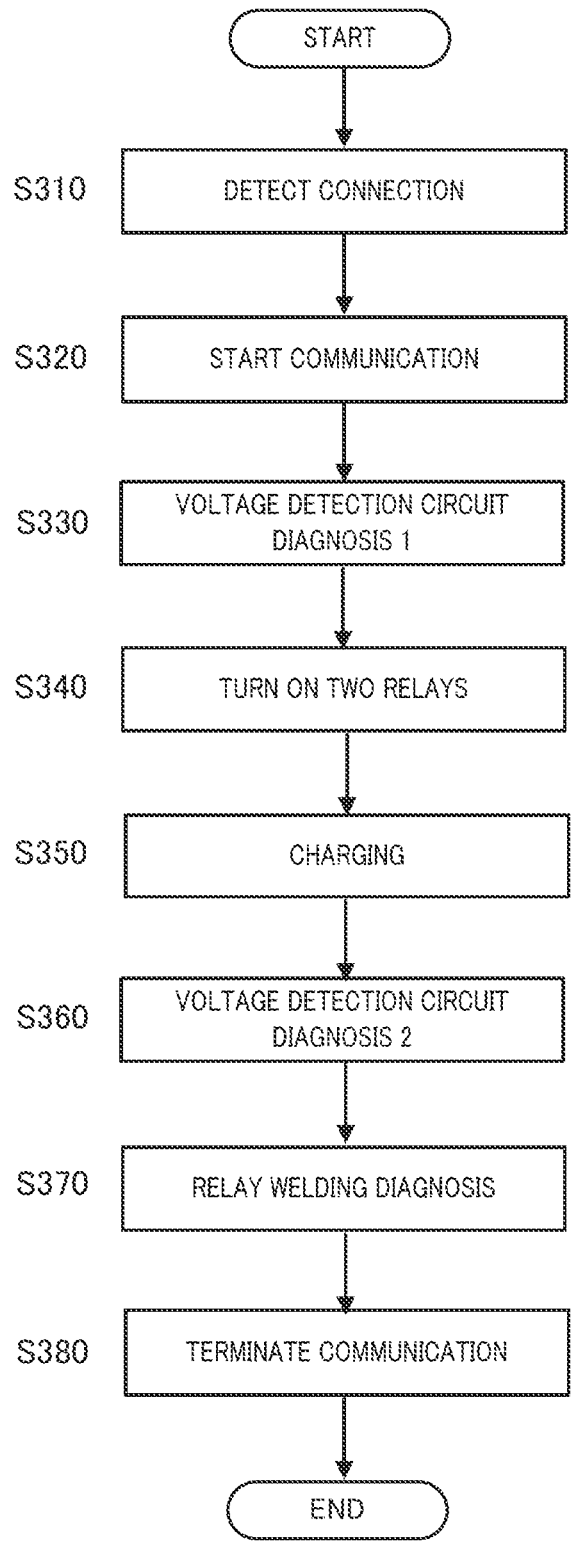
FIG. 3 is a flowchart illustrating an exemplary entire operation performed by the relay welding diagnostic apparatus according to the embodiment of the present invention.

Next, the entire operation of the above-mentioned relay welding diagnostic apparatus according to the present embodiment will be described. FIG. 3 is a flowchart illustrating an exemplary entire operation of the relay welding diagnostic apparatus according to the present embodiment.

The user connects the five connectors so as to connect vehicle 1 and boost charging facility 2 together.

When connection between vehicle 1 and boost charging facility 2 is detected (step S310), control apparatus 10 starts a communication with facility controlling apparatus 21 of boost charging facility 2 (step S320). It is to be noted that, when the above-mentioned (2) is employed as the method for determining a threshold value, control apparatus 10 acquires a resistance value from facility controlling apparatus 21 at this step.

Next, control apparatus 10 performs voltage detection circuit diagnosis 1, and holds the result of the diagnosis ("broken" or "not broken") (step S330).

Next, control apparatus 10 turns on relay 14 and relay 15 in the off state (step S340).

Next, control apparatus 10 sends a charging start control signal to facility controlling apparatus 21. When receiving the charging start control signal, facility controlling apparatus 21 controls AC/DC converting apparatus 20 to start power supply. In this manner, control apparatus 10 performs charging of battery 13 (step S350).

When the charging of battery 13 is terminated, control apparatus 10 performs voltage detection circuit diagnosis 2, and holds the results of the diagnosis ("broken" or "not broken") (step S360).

Next, control apparatus 10 performs the relay welding diagnosis (step S370). Here, in accordance with the results of the diagnosis voltage detection circuit diagnoses 1 and 2 held therein, control apparatus 10 selects and performs one of the normal relay welding diagnosis and the relay welding diagnosis (relay diagnosis mode) of the present embodiment. The details of this step will be described later with reference to FIG. 4.

When the relay welding diagnosis is terminated, control apparatus 10 terminates the communication with facility controlling apparatus 21 (step S380).

The user removes the five connectors, so as to terminate the connection between vehicle 1 and boost charging facility 2.

Figure 4:
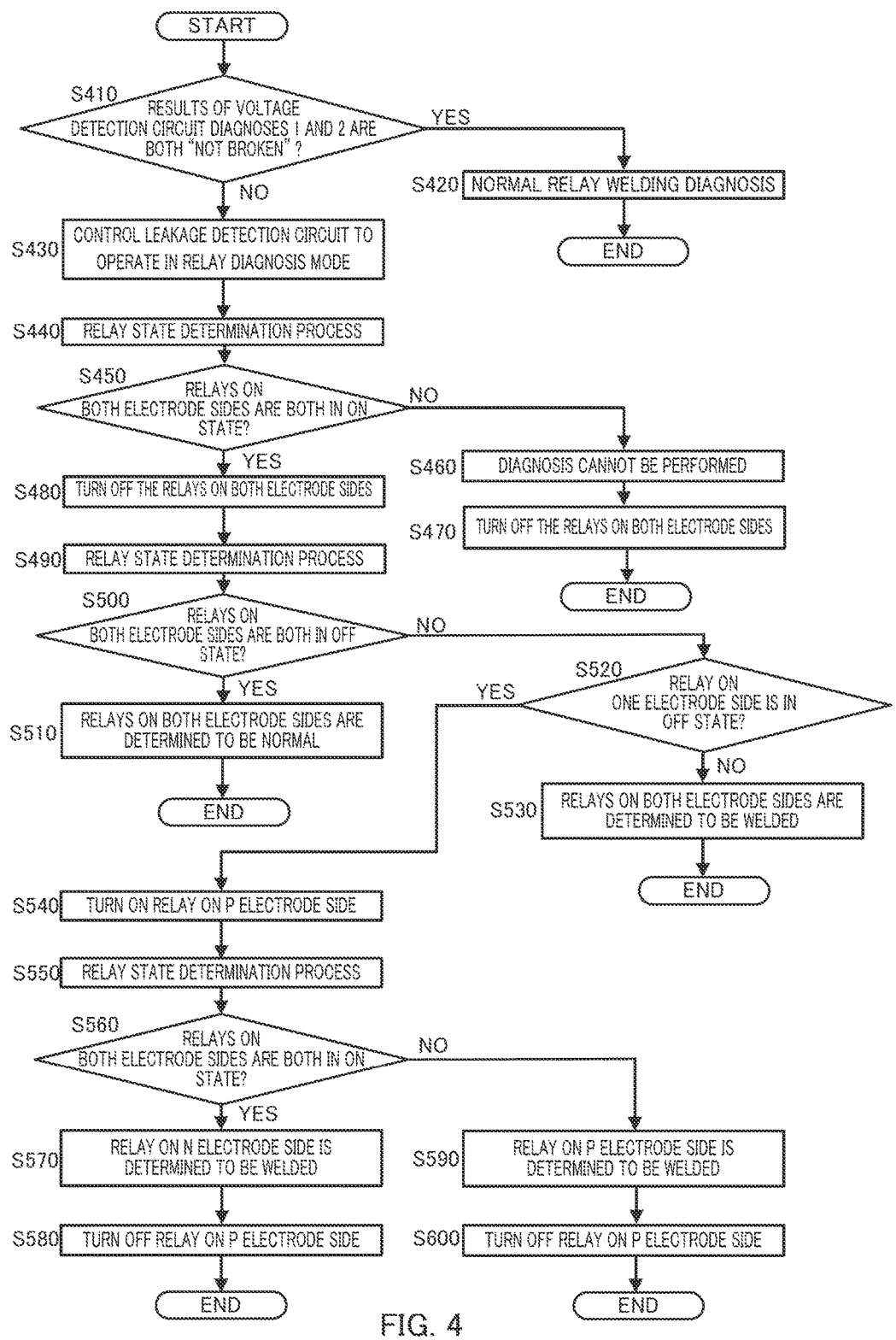
FIG. 4 is a flowchart illustrating an exemplary operation of the relay welding diagnosis performed by the relay welding diagnostic apparatus according to the embodiment of the present invention.

Next, the operation (at step S370 of FIG. 3) of the relay welding diagnosis of the relay welding diagnostic apparatus according to the present embodiment will be described. FIG. 4 is a flowchart illustrating an exemplary operation of the relay welding diagnosis performed by the relay welding diagnostic apparatus according to the present embodiment.

Control apparatus 10 determines whether results of the diagnosis of voltage detection circuit diagnosis 1 and 2 are both "not broken" (step S410).

When the results of voltage detection circuit diagnoses 1 and 2 are both "not broken" (step S410: YES), control apparatus 10 performs the normal relay welding diagnosis (step S420), and terminates the series of processing steps.

On the other hand, when the results of the diagnosis of voltage detection circuit diagnosis 1 and 2 are both not "not broken" (step S410: NO), control apparatus 10 proceeds to step S430.

Control apparatus 10 determines threshold values V1 and V2 for the relay diagnosis mode, and notifies leakage detection circuit 11 of threshold values V1 and V2. Thus, control apparatus 10 controls leakage detection circuit 11 to operate in the relay diagnosis mode (step S430).

Leakage detection circuit 11 executes the relay state determination process (step S440). As described above, the relay state determination process is a process for determining the relay state which represents whether relays 14 and 15 are in the on state or off state.

Figure 5:
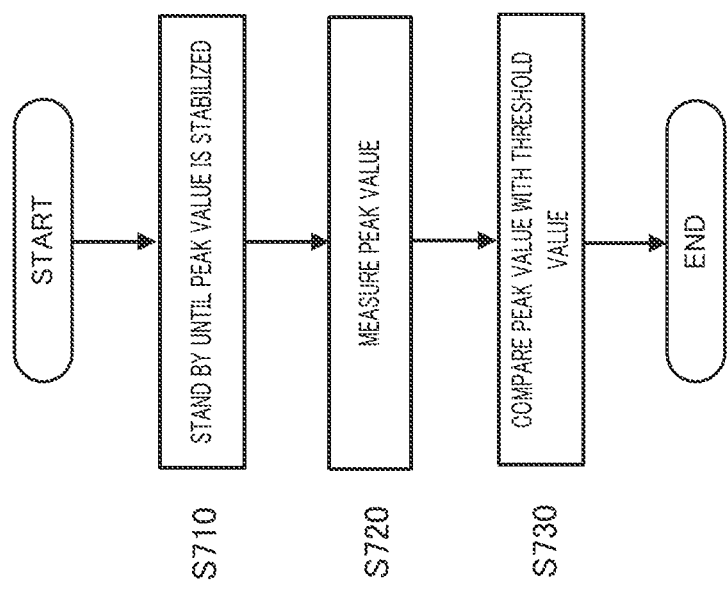
FIG. 5 is a flowchart illustrating an exemplary operation of a determination process performed by the relay welding diagnostic apparatus according to the embodiment of the present invention.

Here, the determination process performed by leakage detection circuit 11 will be described with reference to FIG. 5 and FIGS. 6A to 6C. FIG. 5 is a flowchart illustrating an exemplary operation of the relay state determination process. FIGS. 6A to 6C illustrate an exemplary relationship between a peak value and a threshold value in the relay state determination process.

First, leakage detection circuit 11 stands by until a peak value of a voltage at junction P is stabilized (step S710).

Next, leakage detection circuit 11 performs an analog/digital conversion to thereby measure the peak value of the voltage at junction P (step S720).

Next, leakage detection circuit 11 compares the measured peak value with threshold values V1 and V2 (step S730).

After the comparison, when the peak value is greater than threshold value V2 as illustrated in FIG. 6A, leakage detection circuit 11 determines that the relays on the both electrode sides, that is, both of relay 14 and 15 are in the off state.

After the comparison, when the peak value is greater than threshold value V1 and smaller than V2 as illustrated in FIG. 6B, leakage detection circuit 11 determines that the relay on one electrode side, that is, one of relay 14 and 15 is in the off state.

After the comparison, when the peak value is smaller than threshold value V1 as illustrated in FIG. 6C, leakage detection circuit 11 determines that the relays on the both electrode sides, that is, both of relay 14 and 15 are in the on state.

Here, leakage detection circuit 11 determines whether the result of relay state determination process obtained by the above-mentioned comparison is that the relays on the both electrode sides are both in the on state (step S450). It is to be noted that, at this step, when the above-mentioned (3) is employed as the method for determining the threshold value, leakage detection circuit 11 confirms whether there is a significant difference between peak level A and B. When there is no significant difference, leakage detection circuit 11 proceeds to step S460, and when there is a significant difference, leakage detection circuit 11 proceeds to step S480.

When it is determined that the relays on the both electrode sides are not in the on state (step S450: NO), leakage detection circuit 11 determines that the diagnosis cannot be performed, and notifies control apparatus 10 of the fact that the diagnosis cannot be performed, as the result of the diagnosis by the relay diagnosis mode (step S460). In turn, control apparatus 10 controls notification apparatus 12 to notify the user of the fact that the relay welding diagnosis cannot be performed.

Next, leakage detection circuit 11 requests control apparatus 10 to output a relay control signal for turning off the relays on the both electrode sides, that is, both of relay 14 and 15 (step S470). In turn, control apparatus 10 controls relay 14 and 15 to the off state. In this manner, the series of the processing steps are terminated.

On the other hand, when it is determined that the relays on the both electrode sides are in the on state (step S450: YES), leakage detection circuit 11 requests control apparatus 10 to output a relay control signal for turning off the relays on the both electrode sides (step S480). In turn, control apparatus 10 turns off relay 14 and 15. Then, control apparatus 10 notifies leakage detection circuit 11 of the fact that the relay control signal is output.

Next, leakage detection circuit 11 again performs the above-mentioned relay state determination process (step S490).

Then, leakage detection circuit 11 determines whether the result of the relay state determination process obtained by the above-mentioned comparison is that the relays on the both electrode sides are in the off state (step S500).

When it is determined that, the relays on the both electrode sides are in the off state (step S500: YES), leakage detection circuit 11 determines that the relays on the both electrode sides are in the normal state, and notifies control apparatus 10 of the fact that the relays on the both electrode sides are in the normal state as the result of the diagnosis by the relay diagnosis mode (step S510). In turn, control apparatus 10 controls notification apparatus 12 to notify the user of the fact that the relays on the both electrode sides are in the normal state. In this manner, the series of the processing steps are terminated.

On the other hand, when it is determined that the relays on the both electrode sides are not in the off state (step S500: NO), leakage detection circuit 11 determines whether the relay on one electrode side is in the off state (step S520).

When it is determined that the relay on one electrode side is not in the off state (step S520: NO), leakage detection circuit 11 determines that the relay on one electrode side is welded, and notifies control apparatus 10 of the fact that the relay on one electrode side is welded, as the result of the diagnosis by the relay diagnosis mode (step S530). In turn, control apparatus 10 controls notification apparatus 12 to notify the user of the fact that the relay on one electrode side is welded. In this manner, the series of the processing steps are terminated.

On the other hand, when it is determined that the relay on one electrode side is in the off state (step S520: YES), leakage detection circuit 11 requests control apparatus 10 to output a relay control signal for turning on relay 14 on the P electrode side (step S540). In turn, control apparatus 10 turns on relay 14. Then, control apparatus 10 notifies leakage detection circuit 11 of the fact that the relay control signal is output.

Next, leakage detection circuit 11 again performs the above-mentioned relay state determination process (step S550).

Then, leakage detection circuit 11 determines whether the result of the relay state determination process obtained by the above-mentioned comparison is that the relays on the both electrode sides are in the on state (step S560).

When it is determined that the relays on the both electrode sides are in the on state (step S560: YES), leakage detection circuit 11 determines that relay 15 on the N electrode side is welded, and notifies control apparatus 10 of the fact that relay 15 on the N electrode side is welded as the result of the diagnosis by the relay diagnosis mode (step S570). In turn, control apparatus 10 controls notification apparatus 12 to notify the user of the fact that relay 15 on the N electrode side is welded.

Next, leakage detection circuit 11 requests control apparatus 10 to output a relay control signal for turning on relay 14 on the P electrode side off (step S580). In turn, control apparatus 10 turns off relay 14 on the P electrode side. In this manner, the series of the processing steps are terminated.

On the other hand, when it is determined that the relays on the both electrode sides are not in the on state (step S560: NO), leakage detection circuit 11 determines that relay 14 on the P electrode side is welded, and notifies control apparatus 10 of the fact that relay 14 on the P electrode side is welded, as the result of the diagnosis by the relay diagnosis mode (step S590). In turn, control apparatus 10 controls notification apparatus 12 to notify the user of the fact that relay 14 on the P electrode side is welded.

Next, leakage detection circuit 11 requests control apparatus 10 to output a relay control signal for turning on relay 14 on the P electrode side off (step S600). In turn, control apparatus 10 turns off relay 14 on the P electrode side. In this manner, the series of the processing steps are terminated.

It is to be noted that, while an exemplary case where relay 14 on the P electrode side is turned on at step S540 in the above description, relay 15 on the N electrode side may be turned on. In that case, relay 14 on the P electrode side is determined to be welded at step S570, and relay 14 on the P electrode side is turned off at step S580. Likewise, relay 15 on the N electrode side is determined to be welded at step S590, and the relay on the N electrode side is turned off at step S600.

As has been described, according to the present embodiment, a relay welding diagnosis is performed using a threshold value determined on the basis of a resistance value in a boost charging facility connected with a vehicle, without using a voltage detection circuit. That is, in the present embodiment, even when the voltage detection circuit is broken, a relay welding diagnosis can be executed.

It is to be noted that the expression "boost" of the term "boost charging" in the above-mentioned embodiment is used for convenience of expression. Therefore, it suffices that the term "charging" in the above-mentioned embodiment is charging which uses an electric energy of direct current. In addition, the expression "high pressure" of the term "high pressure line" the above-mentioned embodiment is used for convenience of expression. Therefore, it suffices that the term "voltage" in the above-mentioned embodiment is a voltage which can charge a battery.

While the invention made by the present inventor has been specifically described based on the preferred embodiments, it is not intended to limit the present invention to the above-mentioned preferred embodiments but the present invention may be further modified within the scope and spirit of the invention defined by the appended claims.

For example, in the above-mentioned embodiment, as illustrated in FIG. 2, the relay welding diagnostic apparatus of the present embodiment is composed of control apparatus 10 and leakage detection circuit 11, but the present invention is not limited to this. For example, by additionally providing control apparatus 10 with peak value measurement section 110 and comparison diagnosis section 111, the relay welding diagnostic apparatus of the present embodiment may be composed only of control apparatus 10.

This application is entitled to and claims the benefit of Japanese Patent Application No. 2012-076075 dated Mar. 29, 2012, the disclosure of which including the specification, drawings and abstract is incorporated herein by reference in its entirety.

INDUSTRIAL APPLICABILITY

The relay welding diagnostic apparatus according to the present invention is applicable not only to simple battery-driven electric automobiles, but also to so-called plug-in hybrid vehicles.

REFERENCE SIGNS LIST

1 Vehicle
2 Boost charging facility
3a, 3b, 3c, 3d, 3e Connector
10 Control apparatus
11 Leakage detection circuit
12 Notification apparatus
13 Battery
14 Relay (P electrode side)
15 Relay (N electrode side)
16 Voltage detection circuit
17 Capacitor
18 Communication line
19 Signal line
20 AC/DC converting apparatus
21 Facility controlling apparatus
22 Ammeter
23 Resistor (N electrode side)
24 Resistor (P electrode side)
100 Connection detection section
101 Communication control section
102 Circuit diagnosis section
103 Relay control section
104 Threshold value determination section
110 Peak value measurement section
111 Comparison diagnosis section
112 AC signal output circuit

The invention claimed is:

1. A relay welding diagnostic apparatus configured to be operated by switching between a relay diagnosis mode and a leakage detection mode, the relay diagnosis mode being configured to determine whether relays which are respectively provided on a P electrode side and an N electrode side of a voltage line connecting a charging facility and a battery together are welded, the leakage detection mode being configured to detect a leakage in the voltage line, the relay welding diagnostic apparatus comprising:

an AC signal output circuit that supplies a predetermined AC voltage to the voltage line, the AC signal output circuit being provided separately from the charging facility;

a peak value measurement section that measures a peak value of the voltage supplied to the voltage line from the AC signal output circuit; and a comparison diagnosis section that compares the peak value with a threshold value, wherein in the leakage detection mode, the comparison diagnosis section detects a leakage by comparing the peak value with a threshold value for the leakage detection mode, and in the relay diagnosis mode, the comparison diagnosis section determines a state of the relay by comparing the peak value with a threshold value for the relay diagnosis mode that is different from the threshold value for the leakage detection mode, and determines whether the relay is welded on a basis of the state of the relay thus determined and a state set to the relay.

2. The relay welding diagnostic apparatus according to claim 1 wherein the threshold value for the relay diagnosis mode is based on a resistance value set to a resistor on a P electrode side and a resistance value set to a resistor on an N electrode side, the resistors being provided in the charging facility.

3. The relay welding diagnostic apparatus according to claim 1, wherein the threshold value for the relay diagnosis mode includes a first threshold value and a second threshold value greater than the first threshold value, and the comparison diagnosis section determines that the relays on the both electrode sides are in an off state when the peak value is greater than the second threshold value, determines that the relay on one electrode side is in an off state when the peak value is greater than the first threshold value and smaller than the second threshold value, and determines that the relays on the both electrode sides are in an on state when the peak value is smaller than the first threshold value.

4. The relay welding diagnostic apparatus according to claim 3, wherein the comparison diagnosis section determines that the relays on the both electrode sides are welded when it is determined that the relays on the both electrode sides are in an on state in a case where the relays on the both electrode sides are set to an off state.

5. The relay welding diagnostic apparatus according to claim 3, wherein the comparison diagnosis section determines that the relay other than the relay set to an on state is welded when it is determined that the relays on the both electrode sides are in an on state in a case where the relay on one electrode side is set to an on state, and determines that the relay set to an on state is welded when it is not determined that the relays on the both electrode sides are in an on state in the case where the relay on one electrode side is set to an on state.

6. The relay welding diagnostic apparatus according to claim 1 further comprising:

a voltage detection circuit that detects a voltage on an upstream side of the relay; and a circuit diagnosis section that determines whether the voltage detection circuit is broken on a basis of the voltage detected by the voltage detection circuit, wherein the relay welding diagnostic apparatus operates in the relay diagnosis mode when the circuit diagnosis section determines that the voltage detection circuit is broken.

* * * * *